(12) United States Patent
Gracias (10) Patent No.: US 7,175,680 B2
(45) Date of Patent: Feb. 13, 2007

(54) METHOD TO INCREASE ELECTROMIGRATION RESISTANCE OF COPPER USING SELF-ASSEMBLED ORGANIC THIOLATE MONOLAYERS

(75) Inventor: David H. Gracias, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 54 days.

(21) Appl. No.: 10/997,607

(22) Filed: Nov. 23, 2004

(65) Prior Publication Data

US 2005/0091931 A1 May 5, 2005

Related U.S. Application Data

(62) Division of application No. 10/413,919, filed on Apr. 14, 2003, now Pat. No. 6,858,527.

(51) Int. Cl.
*C09G 1/02* (2006.01)
*C09G 1/04* (2006.01)
*B24B 1/00* (2006.01)

(52) U.S. Cl. .......................... 51/307; 51/308; 51/309; 106/3

(58) Field of Classification Search ................ 51/307, 51/308, 309; 106/3; 438/492, 693
See application file for complete search history.

(56) References Cited

U.S. PATENT DOCUMENTS

| 6,194,317 | B1 * | 2/2001 | Kaisaki et al. ............... 438/692 |
| 6,323,131 | B1 * | 11/2001 | Obeng et al. ................ 438/687 |
| 6,569,707 | B2 * | 5/2003 | Dimitrakopoulos et al. .. 438/99 |
| 2002/0177316 | A1 * | 11/2002 | Miller et al. ................. 438/689 |
| 2003/0083214 | A1 * | 5/2003 | Kakizawa et al. ........... 510/175 |
| 2003/0168627 | A1 * | 9/2003 | Singh et al. ................ 252/79.1 |
| 2003/0175551 | A1 * | 9/2003 | Smith et al. ................. 428/690 |
| 2004/0132308 | A1 * | 7/2004 | Obeng ......................... 438/692 |

OTHER PUBLICATIONS

Gandikota, Srinivas, et al., Cobalt Alloy Thin Films for Encapsulation of Copper, Applied Materials, Inc., 3303 Scott Boulevard, Santa Clara, CA 95054, Advanced Metallization Conference, 2002, pp. 1-3.

Hu, C.-K, et al., Reduced electromigration of Cu wires by surface coating; Applied Physics Letters, vol. 81, No. 10, Sep. 2, 2002, pp. 1782-1784, © 2002 American Institute of Physics.

Laibinis, Paul E., et al., Self-Assembled Monolayer of n-Alkanethiolates on Copper Are Barrier Films That Protect the Metal against Oxidation by Air[1], Journal of the American Chemical Society, vol. 114, No. 23, Nov. 4, 1992, pp. 9022-9028, © 1992 American Chemical Society.

Laibinis, Paul E., et al., Comparison of the Structures and Wetting Properties of Self-Assembled Monolayers of n-Alkanethiols on the Coinage Metal Surfaces, Cu, Ag, Au[1], Journal of the American Chemical Society, vol. 113, No. 19, Sep. 11, 1991, pp. 7152-7167, © 1991 American Chemical Society.

Padhi, Deenesh, et al., Electrodeposition of Copper-Tin Alloy for Enhancement of Electromigration and Stress Migration Resistance in ULSI Era, Applied Materials, Inc, 3303 Scott Bouelvard, Santa Clara, CA 95054, Advanced Metallization Conference, 2002, pp. 1-2.

Usmani, S., et al., Use of BTA for Corrosion Protection and Surface Modification of Cu in Post-CMP Rinses, Motorola, Austin, TX 78721, AMD Fab30, Dresden, Germany, Advanced Metallization Conference, 2002, 2 pages.

Wasserman, Stephen R., et al., Monolayers of 11-trichlorosilylundecyl thioacetate: A system that promotes adhesion between silicon dioxide and evaporated gold, Journal of Materials Research, vol. 4, No. 4, Jul./Aug. 1989, Published by the Materials Research Society, pp. 886-892.

* cited by examiner

*Primary Examiner*—Michael Marcheschi
(74) *Attorney, Agent, or Firm*—Blakely, Sokoloff, Taylor & Zafman LLP (57) ABSTRACT

Methods and solutions for forming self assembled organic monolayers that are covalently bound to metal interfaces are presented along with a device containing a self assembled organic monolayer. Embodiments of the present invention utilize self assembled thiolate monolayers to prevent the electromigration and surface diffusion of copper atoms while minimizing the resistance of the interconnect lines. Self assembled thiolate monolayers are used to cap the copper interconnect lines and chemically hold the copper atoms at the top of the lines in place, thus preventing surface diffusion. The use of self assembled thiolate monolayers minimizes the resistance of copper interconnect lines because only a single monolayer of approximately 10 Å and 20 Å in thickness is used.

7 Claims, 10 Drawing Sheets

METHOD TO INCREASE ELECTROMIGRATION RESISTANCE OF COPPER USING SELF-ASSEMBLED ORGANIC THIOLATE MONOLAYERS

The present patent application is a divisional of application Ser. No. 10/413,919 filed Apr. 14, 2003, now U.S. Pat. No. 6,858,527.

BACKGROUND OF THE INVENTION

1. Field of the Invention

Embodiments of the present invention relate to the field of making reliable semiconductor devices, and in particular the prevention of the electromigration of copper lines.

2. Discussion of Related Art

Advances in semiconductor manufacturing technology have led to the development of integrated circuits having multiple levels of interconnect. In such an integrated circuit, patterned conductive material on one interconnect level is electrically insulated from patterned conductive material on another interconnect level by films of material such as, for example, silicon dioxide. These conductive materials are typically a metal or metal alloy. Connections between the conductive material at the various interconnect levels are made by forming openings in the insulating layers and providing an electrically conductive structure such that the patterned conductive material from different interconnect levels are brought into electrical contact with each other. These electrically conductive structures are often referred to as contacts or vias.

Other advances in semiconductor manufacturing technology have lead to the integration of millions of transistors, each capable of switching at high speed. A consequence of incorporating so many fast switching transistors into an integrated circuit is an increase in power consumption during operation. One technique for increasing speed while reducing power consumption is to replace the traditional aluminum and aluminum alloy interconnects found on integrated circuits with a metal such as copper, which offers lower electrical resistance. Those skilled in the electrical arts will appreciate that by reducing resistance, electrical signals may propagate more quickly through the interconnect pathways on an integrated circuit. Furthermore, because the resistance of copper is significantly less than that of aluminum, the cross-sectional area of a copper interconnect line, as compared to an aluminum interconnect line, may be made smaller without incurring increased signal propagation delays based on the resistance of the interconnect.

As device dimensions shrink, so does conductor width—leading to higher resistance and current density. Increasing current density leads to the phenomenon of electromigration. Electromigration is generally the movement of atoms in a metal interconnect in the direction of current flow. Most metal atoms that move during electromigration are displaced at the top of an interconnect line where there is no barrier layer to prevent their displacement. This is called surface diffusion. Surface diffusion can cause vacancies, which lead to voids and hillocks, and ultimately to electromigration failure of the device.

Others have tried to solve this problem by alloying the copper lines with another metal. One method includes the doping of the entire metal interconnect line with metallic dopants in order to prevent movement of the atoms of the metal interconnect line in the direction of the current flow. The dopants will either physically inhibit the movement of copper atoms or enlarge the copper grain size such that the diffusion path of the copper atoms is eliminated. However, blanket doping of the metal interconnect layer results in an increased resistivity of the interconnect layer, which degrades performance of the semiconductor device. In response to this increased resistivity the portion of the copper line that is doped has been decreased to only the outer edges or the top of the line to prevent surface diffusion. Shunt layers have also been used to prevent electromigration. Shunt layers are thin electrically conductive layers formed around the copper lines. Shunt layers prevent electromigration by physically inhibiting the movement of copper atoms. Additionally, shunt layers are several hundred angstroms thick and result in increased line to line leakage due to non-selective deposition. But, due to the further scaling down of devices and the narrowing of copper interconnect lines, the resistance caused by the doping of the outer layers of the lines and by the shunt layers has become significant.

Embodiments of the invention provide processes and devices that more effectively reduce electromigration, in particular surface diffusion, without significantly increasing conductor resistance. These embodiments are valuable in minimizing the electromigration of scaled down copper lines.

DETAILED DESCRIPTION OF THE PRESENT INVENTION

Devices and methods employing thiolate layers to prevent the electromigration of copper interconnects are described. In the following description numerous specific details are set forth to provide, an understanding of the embodiments of the present invention. It will be apparent, however, to those skilled in the art and having the benefit of this disclosure, that the embodiments of the present invention may be practiced with materials and processes that vary from those specified here.

TERMINOLOGY

The terms chip, integrated circuit, monolithic device, semiconductor device or component, microelectronic device or component, and similar terms and expressions, are often used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnects or simply metal.

The terms contact and via both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

The term copper interface refers to the copper surface that is exposed after a copper layer has been planarized by chemical mechanical polishing. A copper interface is typically an exposed copper line or via that will be subsequently covered with another layer to form a functional semiconductor device.

The term self-assembled monolayer refers to a film that is formed by molecules that will react with a surface in such a way that they line up in a uniform manner to create a homogeneous film that is only one molecule thick. Specifically, they "self assemble " because each self-assembling molecule forms a highly selective bond with copper and orientates itself perpendicular to the face of the copper surface. Through this reaction a uniform monolayer film is formed.

The terms thiol, thiolate, and X-alkanethiolate all refer to compounds containing sulfur. A thiol is a sulfur containing compound where the sulfur atom is terminated by hydrogen (X-S-H). A thiolate is a more general term, referring to compounds where the sulfur is bound to Any substituent including copper (X-S-Y). X-alkanethiolates refer to thiolates where the sulfur is bound to an organic compound that is alkane based and the alkane is terminated by a substituent X $(X-(CH_2)_n-S-Y)$.

Embodiments of the Invention

Methods and solutions for forming organic layers covalently bound to metal layers are presented along with devices containing organic layers covalently bound to metal layers. In a preferred embodiment, organic monolayers that form covalent bonds to metal by self-assembly are utilized to prevent the electromigration and surface scattering of copper atoms while minimizing the resistance of the interconnect lines. Electromigration and surface diffusion is prevented because the organic layer is covalently bound to the metal atoms in the metal interface. The covalent bonds will chemically hold the metal atoms in place. Additionally, in a preferred embodiment, the organic molecules in the organic layer are relatively large and will help hold the metal atoms in place because it is virtually impossible for metal atoms to migrate when covalently bound to large organic molecules. The resistance of the interconnect lines is minimized because, in a preferred embodiment, only a single monolayer of organic material is used.

In a preferred embodiment the organic layer is a self assembled thiolate monolayer and the metal layer is copper. Self assembled thiolate monolayers are valuable because they can form thin (10 Å to 20 Å) layers that will cap copper interconnect lines and chemically hold the copper atoms at the copper interfaces at the top of the lines in place, thus preventing electromigration and surface scattering.

Figure 1A:
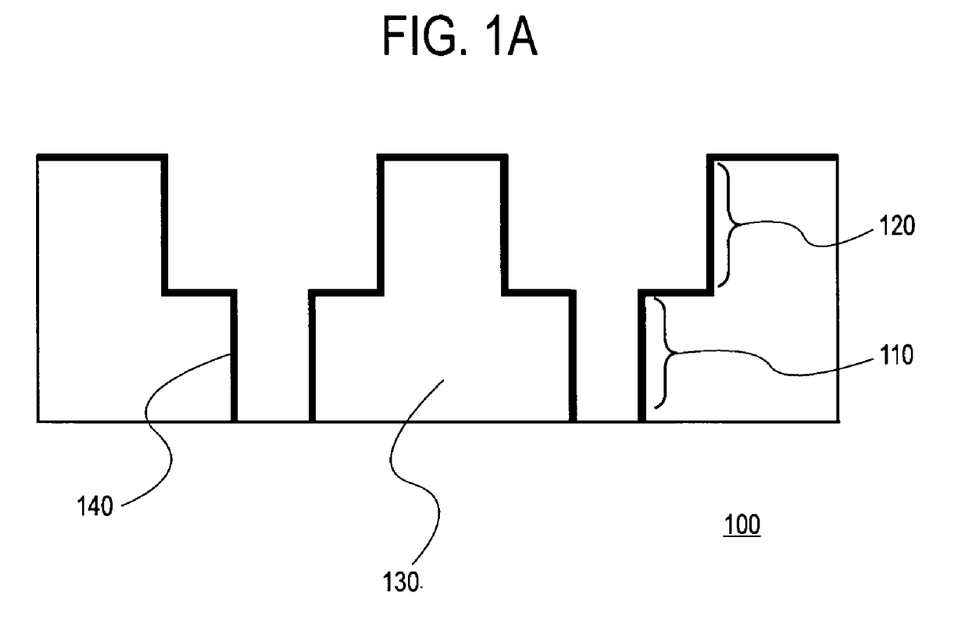
FIG. 1a is an illustration of a cross-sectional view of a dual damascene structure after the dielectric layer has been etched to form both vias and trenches.
Figure 1B:
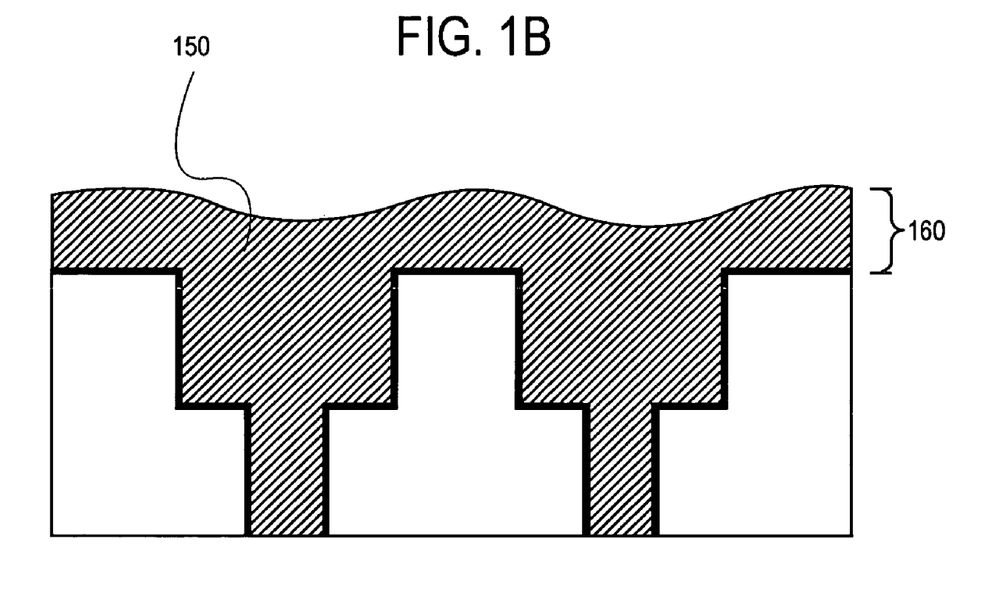
FIG. 1b is an illustration of a cross-sectional view of a dual damascene structure after the vias and trenches have been filled with a copper layer.
Figure 1C:
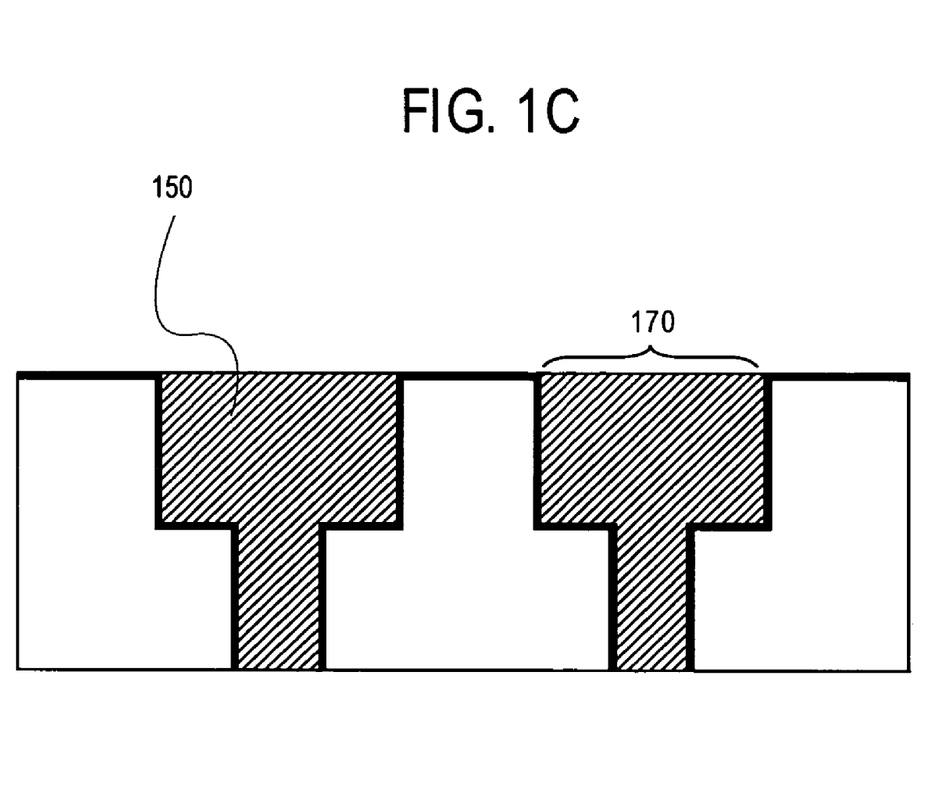
FIG. 1c is an illustration of a cross-sectional view of a dual damascene structure after the copper layer has been polished.

Copper interconnect lines are formed by way of a damascene, or inlaid, metal process. Typically a dual damascene process is used to form both vias and trenches in a single layer. FIG. 1a illustrates a dual damascene structure 100 after vias 110 and trenches 120 have already been etched into dielectric layer 130. A barrier layer 140 can optionally be formed over the patterned dielectric layer 130. FIG. 1b illustrates the dual damascene structure after the vias 110 and trenches 120 have been filled with copper 150. The excess copper layer 160 is then polished using chemical mechanical polishing (CMP), resulting in the planarized dual damascene structure illustrated in FIG. 1c. After CMP, copper interfaces 170 are exposed at the top of the copper lines.

Figure 2:
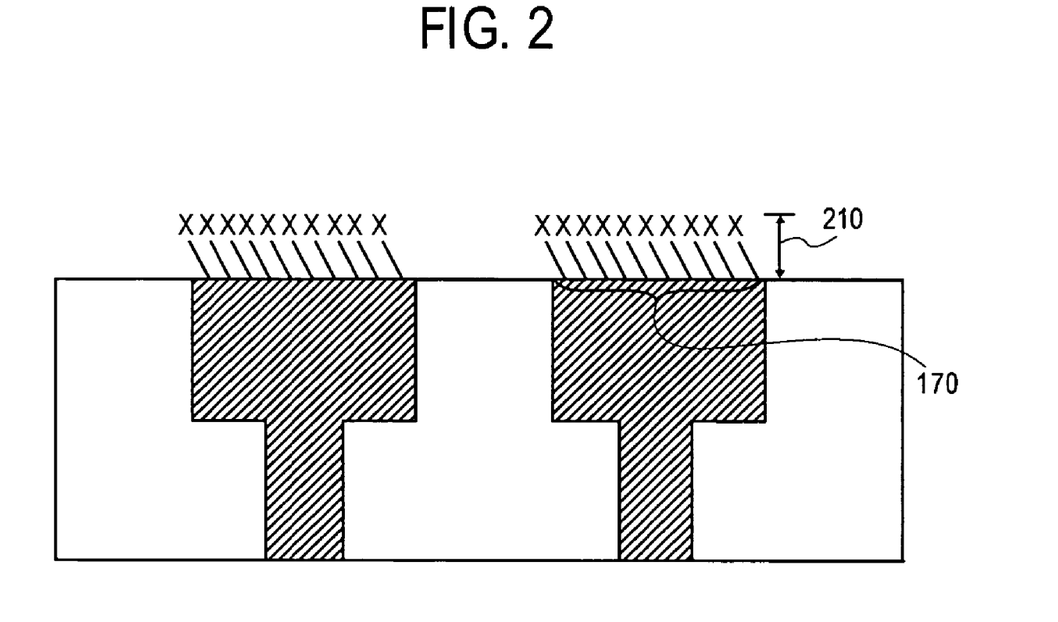
FIG. 2 is an illustration of a cross-sectional view of the copper damascene structure of FIG. 1 after a self-assembled organic monolayer has been covalently bound to the copper interfaces.
Figure 3A:
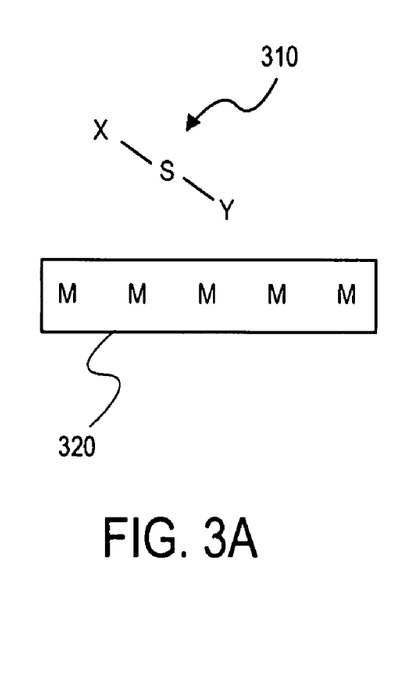
FIGS. 3a, 3b, 3c illustrate a thiolate molecule reacting with a metal surface.
Figure 3B:
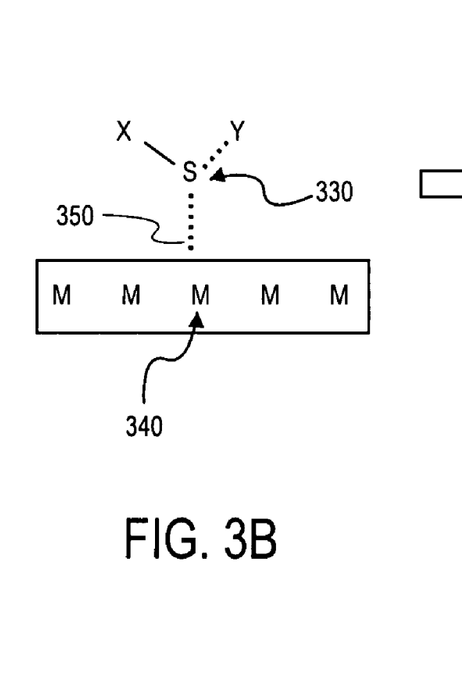
Figure 3C:
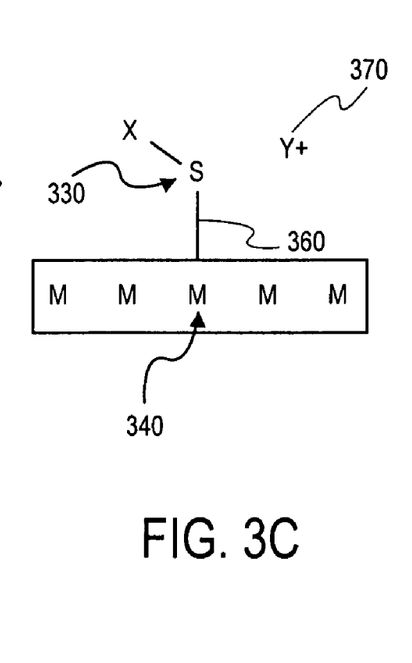

FIG. 2 illustrates an embodiment of the present invention where an organic layer 210 is has formed covalent bonds with the copper interface 170 by self assembly to form a monolayer. In a preferred embodiment the organic molecules are thiolates. Thiolates are sulfur containing molecules (X-S-Y) that react with metallic interfaces and form linkages between the sulfur atom and the metal surface (X-S-M). The species Y in a thiolate (X-S-Y) is a surface active agent that reacts with the copper interface to form the bond between the sulfur of the thiolate and the copper of the interface. The species Y can be any surface active agent including but not limited to H, COOH, $CH_3$, Cl, and F, where using Cl or F will aid in the solubility of the thiolate molecule. The reaction between the species Y of a thiolate and a metal interface to form an X-S-M linkage is illustrated in FIG. 3. As the thiolate molecule 310 comes into close proximity with the metal surface 320 (illustrated at 3a) the sulfur atom 330 will become attracted to a metal atom 340 at the metal surface and begin to form a bond 350 with the metal atom 340, as illustrated at 3b. Next, as illustrated at 3c, a covalent bond 360 forms between the sulfur atom 330 and the metal atom 340, breaking the bond between the sulfur atom 330 and the species Y 370 to form an X-S-M linkage.

Figure 4:
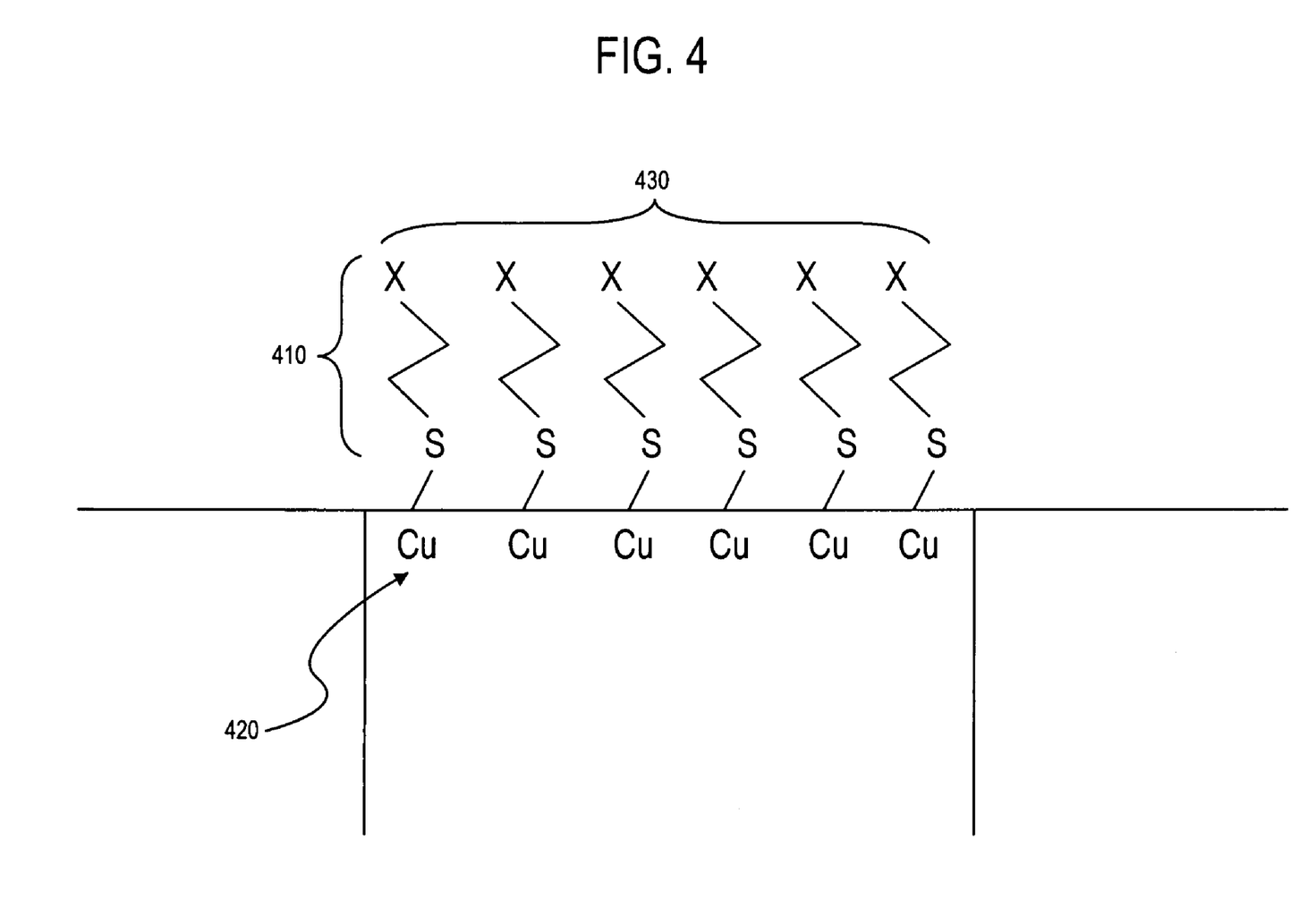
FIG. 4 is an illustration of a cross-sectional view of a copper interface on which a self-assembled thiolate monolayer has been formed. The chemical bond between the copper and sulfur atoms is featured.

In an embodiment of the present invention, as illustrated in FIG. 4, this reaction will occur between X-alkanethiolate molecules 410 and the exposed copper atoms 420 at a copper interface to form a self-assembled thiolate monolayer 430. Covalent bonds are the strongest type of bond. This chemical bond will chemically hold the copper atoms in place to prevent surface diffusion. This is in contrast to copper alloys and metal shunt layers that merely block the movement of copper atoms because they do not form covalent bonds with copper. Physically blocking the copper atoms is not as effective as the chemical bond formed by thiolates with copper. The species X may be any type of substituent, but is preferably an organic substituent. Organic substituents will not cause shorts or increased leakage for narrow lines because they are nonconductive. Additionally the species X can be readily manipulated. The species X can be selected to tailor the diffusion coefficient of copper at the copper interface. The larger the molecule that is attached to the copper atoms, the less the copper atoms will be able to move. The molecular species X can be modified to be as large or bulky as possible. It is virtually impossible for a copper atom to diffuse at room temperature when it is attached to a sizeable organic group because of reduced mobility. In a preferred embodiment, these sizeable organic substituents will be in the form of alkanes that are part of the thiolates. These types of molecules will be referred to as X-alkanethiolates. The optimal size of the X-alkanethiolates (X—(CH2)n—S-Y) is where n=11 or 18. But n may be any number of alkane (CH2) groups. An X-alkanethiolate where n=11 is called an undecyl thiolate and an X-alkanethiolate where n=18 is called an octadecyl thiolate.

An additional advantage of X-alkanethiolates, and in particular undecyl and octadecyl thiolates, is that they improve the corrosion resistance of copper films to oxidation. X-alkanethiolates are anti-corrosive because they form densely packed monolayer structures and form strong covalent bonds with the copper atoms that prevent the oxidation of Cu. The anti-corrosive properties are increased when a hydrophobic (water repelling) substituent is chosen as the X-group for X-alkanethiolates.

Additionally, undecyl and octadecyl thiolates will form a monolayer having the optimal thickness. The thickness of the monolayer is preferably between 10 Å and 40 Å and optimally between 10 Å and 20 Å. It is valuable that the monolayer has a thickness greater than 10 Å to protect against corrosion. Also, it is valuable that the monolayer has a thickness less than 40 Å to minimize the resistance of the interconnect line.

Figure 5:
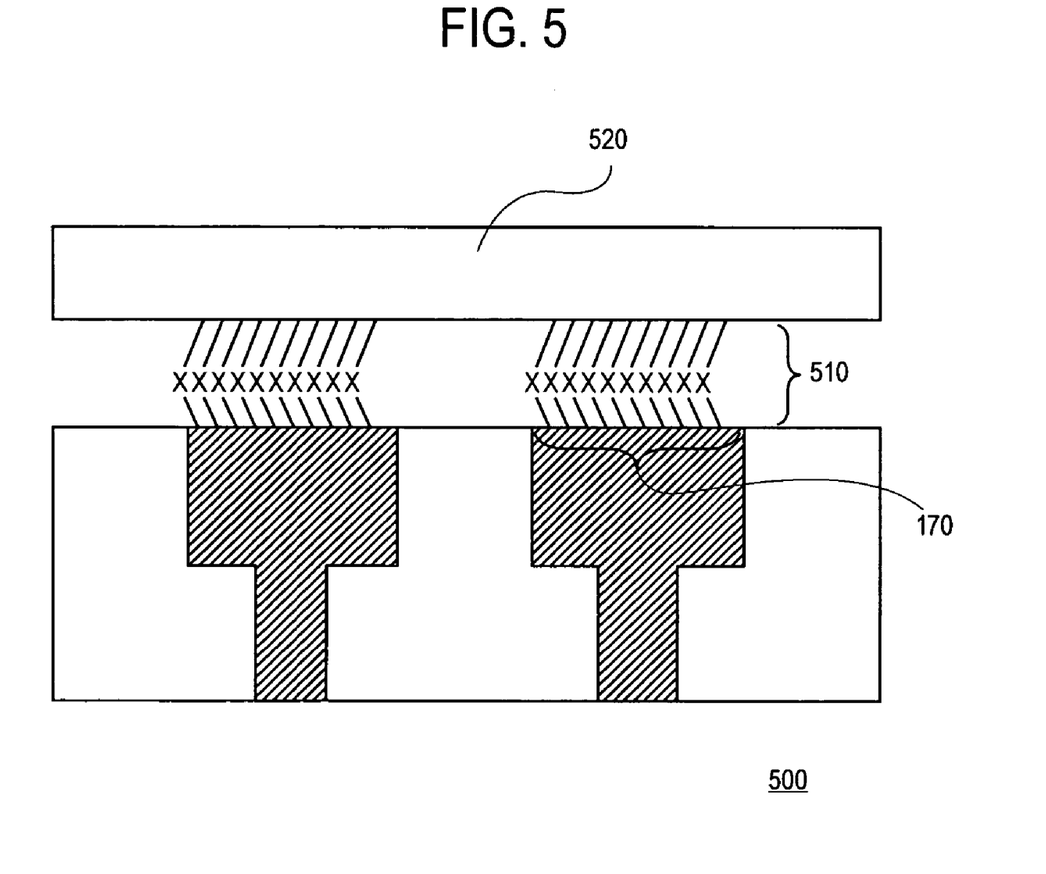
FIG. 5 is an illustration of a cross-sectional view of the copper damascene structure of FIG. 1c after a self-assembled organic monolayer has been formed on the copper interfaces and a silicon based layer has been formed over the thiolate monolayer.

The X-group substituent of X-alkane thiolates can also be chosen to promote adhesion between different surfaces, and in particular between copper interfaces and materials formed on the copper interfaces. The type of substituent that will work the best depends on the type of material that will be deposited on the copper interface. Typically a silicon based material is used to form an interlayer dielectric (ILD) or etch stop (ES) layer on the copper interface. Silanes are a good choice for the X-group of X-alkanethiolates when silicon based materials are formed on the copper interface. FIG. 5 shows a covalently bound organic monolayer 510 acting as an adhesive between copper interfaces 170 of a copper damascene structure 500 and a silicon based layer 520.

Figure 6:
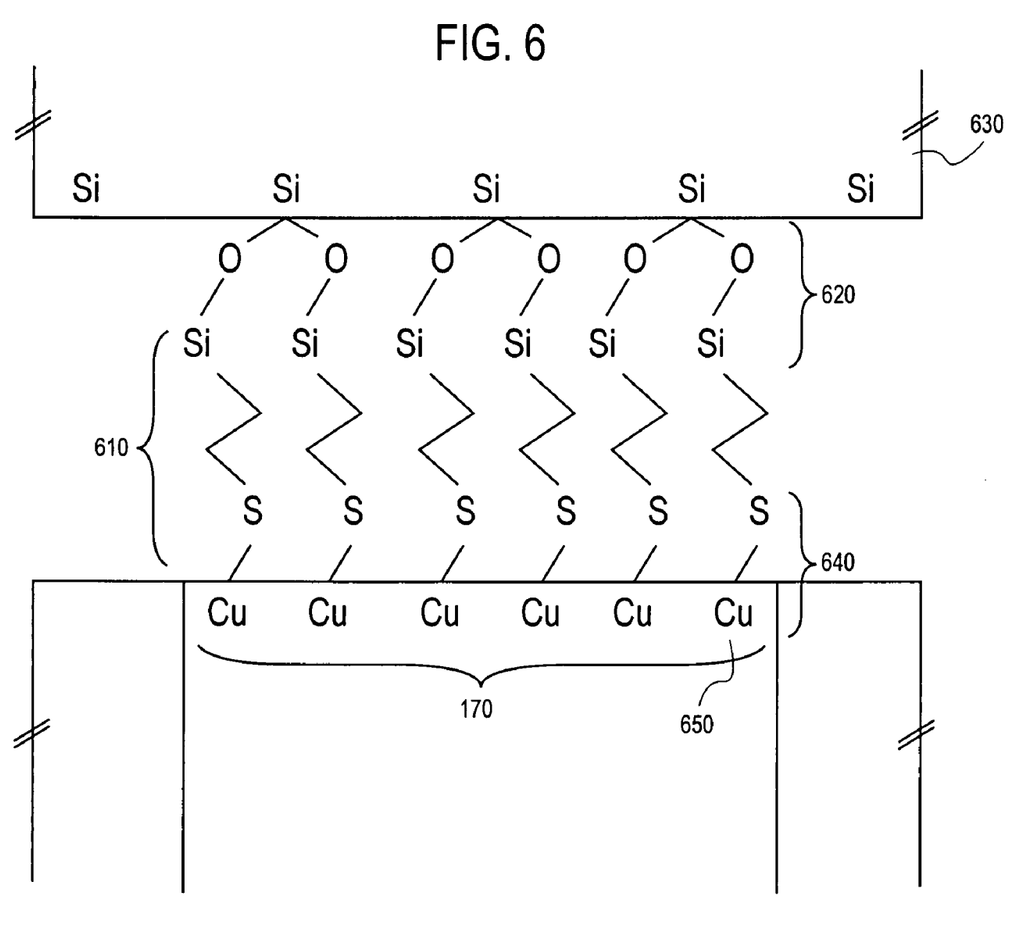
FIG. 6 is an illustration of a cross-sectional view of a copper interface on which a monolayer of 11-trichlorosilyl undecyl thioacetate has been formed, one which a silicon based layer has been formed. The chemical bonds between the copper interface, the monolayer, and the silicon based layer are featured.

An ideal adhesion promoting thiolate is 11-trichlorosilyl undecyl thioacetate. This molecule has been shown to promote adhesion between silicon dioxide and metals such as gold. FIG. 6 illustrates a monolayer of 11-trichlorosilyl undecyl thioacetate 610 formed on a copper interface 170. An S—Cu bond is formed between the copper atoms 640 and the thiolate 610. And, an Si—O—Si bond 620 is formed between an ILD or an ES (etch stop) layer 630 and the thiolate 610. Typically the silicon based layer 630 is an etch stop layer made of SiN or SiON. The Si—O—Si chemical bond is the key to the strong adhesion between the copper interface and the silicon based layer.

The organic layer covalently bound to a metal layer can be formed by several different methods. Embodiments of some exemplary methods are presented below. In general, an organic layer covalently bound to a metal layer is formed by applying a solution containing self-assembling organic molecules to a metal interface. The self-assembling organic molecules will adsorb from the solution onto the metal interface to form the organic layer. In a preferred embodiment the organic layer is a monolayer, that is, it has a thickness of one organic molecule. To form a monolayer, the concentration of self-assembling molecules in the solution is such that there is one self-assembling molecule for every one metal atom to which the solution will be exposed. By using this concentration it will be ensured that only a monolayer of the self-assembling molecules is formed. The amount of non-conductive organic material used is thereby minimized, that will in turn minimize the increase in resistance of the metal lines. Additionally, the monolayer is very thin and can be etched away before forming a via. In a preferred embodiment the self-assembling organic monolayer is a thiolate.

Figure 7:
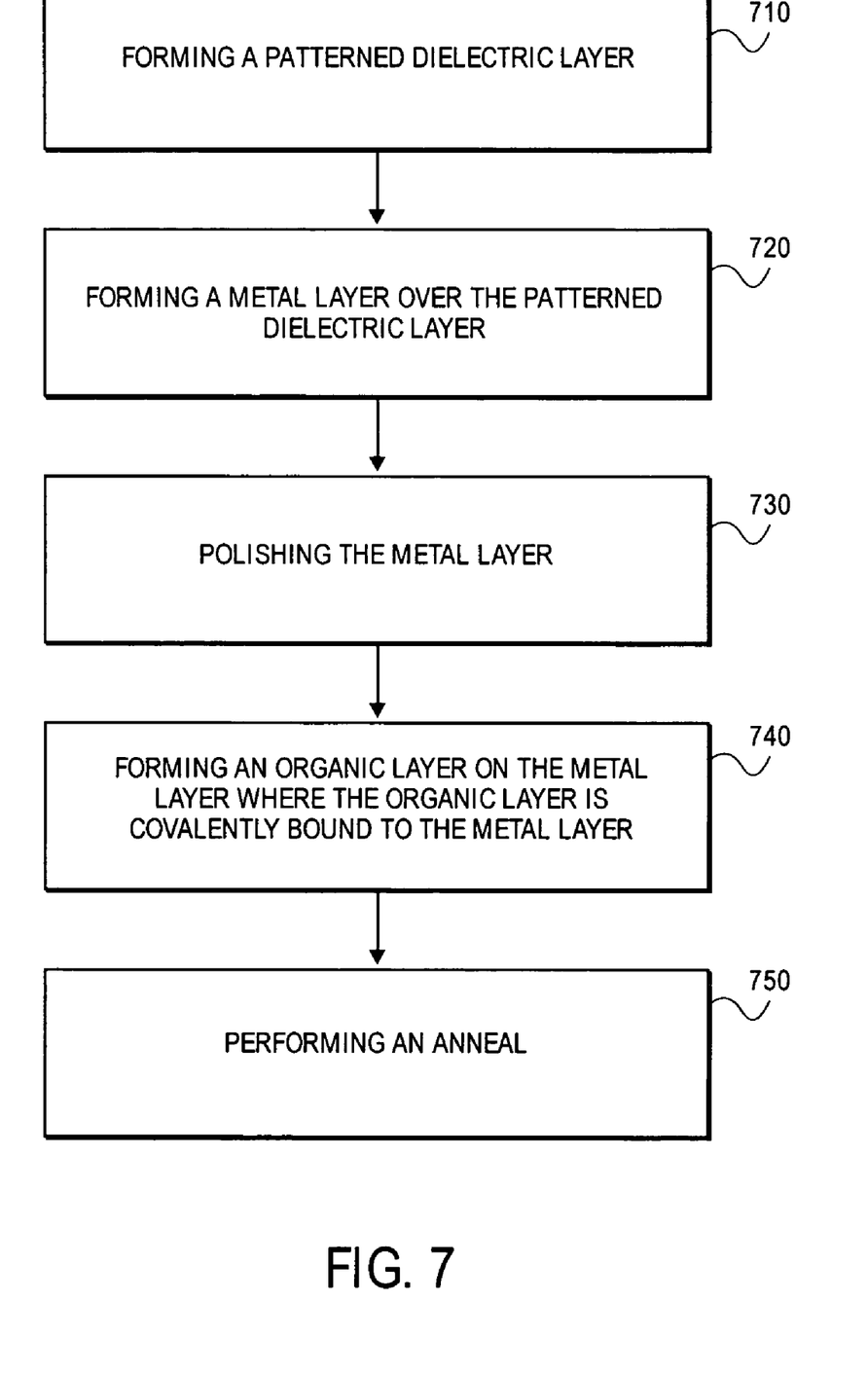
FIG. 7 is a flow chart showing a copper damascene process of forming a semiconductor device including forming an organic layer that is covalently bound to a metal layer.

In an embodiment, the organic layer covalently bound to a metal layer is formed after CMP (chemical mechanical polishing). FIG. 7 depicts a flow diagram of a method embodying a typical damascene process employing an embodiment of the present invention. At block 710 a patterned dielectric layer is formed. Typically the dielectric layer will be patterned to have several trenches and vias using the dual damascene process described above. At block 720 a metal layer is formed over the patterned dielectric layer. Then, at block 730 the metal layer is polished. After polishing, the covalently bound organic layer is formed on the polished metal interfaces at block 740 using a solution containing self-assembling organic molecules. In a preferred embodiment the self-assembling organic molecules are thiolates. The solution can be sprayed or poured onto the substrate or the substrate may be immersed into a bath containing the solution. In an embodiment, the solution containing the self-assembling organic molecules is a mixture of the self-assembling organic molecules and a solvent. The solvent is chosen based on the specific self-assembling molecule that needs to be solvated. In an embodiment, solvents such as isooctane, chloroform, tetrahydrofuran, acetonitrile, acetone, and ethanol may be used. In an alternate embodiment a gaseous solution of the self-assembling organic molecules is used. The gaseous solution would contain a gaseous form of the self-assembling organic molecules. In a preferred embodiment the organic molecules are gaseous thiolates. A carrying gas such as argon may also be mixed with the gaseous organic molecules. The gas would be applied to the substrate by spraying or by exposing the substrate to the gas. Optionally, an anneal is subsequently performed at block 750 on the organic layer to better align the self-assembled organic molecules into a uniform structure.

Figure 8:
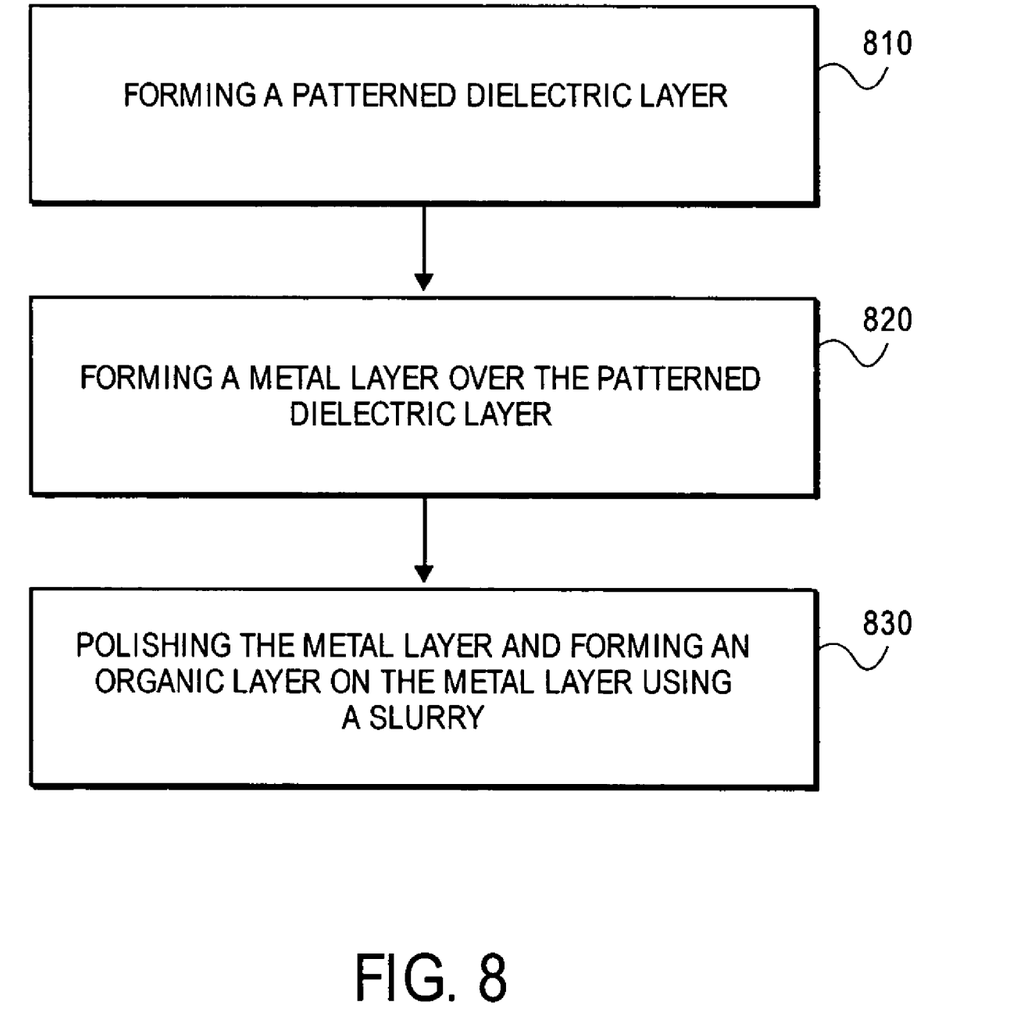
FIG. 8 is a flow chart showing a copper damascene process of forming a semiconductor device including a polishing step during which an organic layer that is covalently bound to a metal layer is formed by a slurry.

In an alternate embodiment, the organic layer is formed during the chemical mechanical polishing (CMP) step. This has the advantage of not adding an extra step to the processing of a semiconductor device. FIG. 8 depicts a flow diagram of a method where the covalently bound organic layer is formed during the CMP step. At block 810 a patterned dielectric layer is formed. Next, at block 820 a copper layer is formed over the patterned dielectric layer. The CMP step is then performed at block 830. During this CMP step an organic layer that will form covalent bonds with the metal layer is formed on the metal layer by using a slurry containing self-assembling organic molecules. An exemplary slurry would contain self-assembling organic molecules, an abrasive, an oxidizing agent, and a chelating buffer system. The concentration of self-assembling organic molecules in the slurry is such that a self-assembled organic monolayer is formed. In a preferred embodiment the self-assembling organic molecules are thiolates. Typical abrasives include silica, alumina, and ceria. The oxidizing agent is typically hydrogen peroxide. And, the chelating buffer system is typically a mixture of citric acid and potassium citrate.

Figure 9:
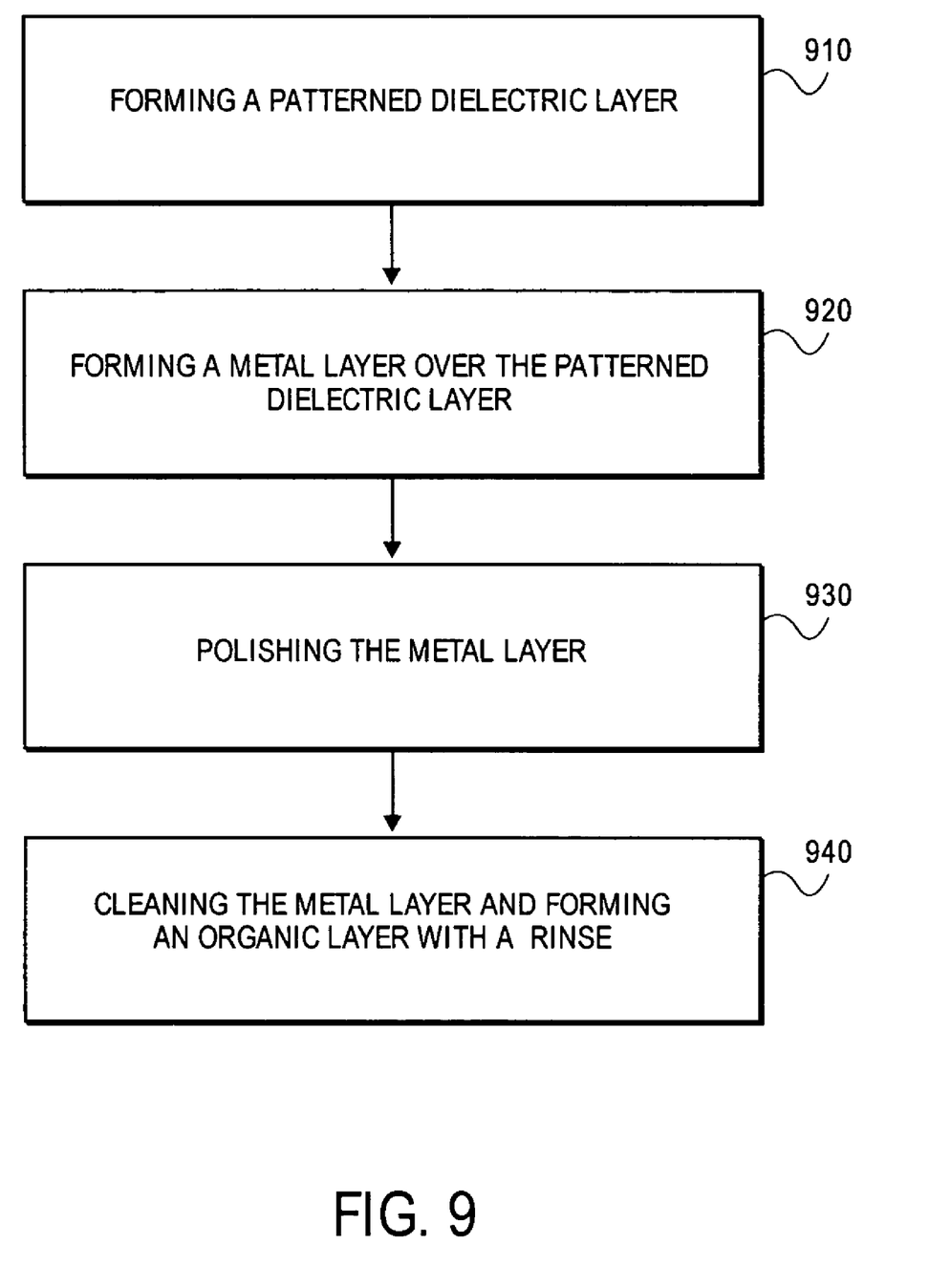
FIG. 9 is a flow chart showing a copper damascene process of forming a semiconductor device including a cleaning step during which an organic layer that is covalently bound to a metal layer is formed by a rinse.

In an alternate embodiment, the covalently bound organic layer is formed during the cleaning performed after CMP. This method has the advantage of not adding an extra step to the processing of a semiconductor device. FIG. 9 depicts a flow diagram of a method where the covalently bound organic layer is formed during cleaning. At block 910 a patterned dielectric layer is formed. Next, at block 920 a metal layer is formed over the barrier layer. The metal is then polished at block 930. Following the polishing, the copper layer is cleaned at block 940 with a rinse containing self-assembling organic molecules that will form covalent bonds with the metal interface. During the cleaning step the covalently bound organic layer is formed. An exemplary rinse would contain self-assembling organic molecules, water, and an alcohol such as isopropyl alcohol or a weak acid such as citric acid. In a preferred embodiment the self-assembling organic molecules are thiolates. The concentration of self-assembling organic molecules in the rinse is such that a self-assembled organic monolayer is formed.

The components of the solutions, slurries, and rinses presented above may remain in their original chemical form as they existed before they were added to the mixture or they may combine to form chemical compounds or ionic species different from the original components as they existed before they were added to the mixture.

CONCLUSION

Embodiments of the present invention provide methods and solutions for forming a semiconductor device containing an organic layer that is self-assembled and covalently bound to a metal interface. Various embodiments of such a device are also presented. In a preferred embodiment the covalently bound organic layer is a thiolate and the metal to which it is covalently bound is copper. These embodiments employing covalently bound organic layers prevent the electromigration and surface diffusion of metal lines, and in particular of copper lines. Embodiments of the present invention are valuable in minimizing the electromigration of scaled down copper lines without significantly increasing the resistance of copper lines.

Other modifications from the specifically described devices, solutions, and processes will be apparent to those skilled in the art and having the benefit of this disclosure. Accordingly, it is intended that all such modifications and alterations be considered as within the spirit and scope of the invention as defined by the subjoined claims.

I claim:

1. A slurry for polishing metal, comprising:
   an X-alkane thiolate to form a self assembled organic layer on a copper interface during a CMP process, the self assembled organic layer covalently bound to a silicon dioxide layer that is formed on the self assembled organic layer, wherein X includes a silane group;
   an abrasive;
   an oxidizing agent; and
   a buffer system.

2. The slurry of claim 1, wherein the X-alkane thiolate comprises an undecyl thiolate.

3. The slurry of claim 2, wherein the undecyl thiolate comprises 11-trichlorosilyl undecyl thioacetate.

4. The slurry of claim 1, wherein the X-alkane thiolate comprises octadecyl thiolate.

5. The slurry of claim 1, wherein the abrasive is selected from the group consisting of silica, alumina, or ceria.

6. The slurry of claim 1, wherein the oxidizing agent comprises hydrogen peroxide.

7. The slurry of claim 1, wherein the buffer system comprises a mixture of citric acid and potassium citrate.

* * * * *

UNITED STATES PATENT AND TRADEMARK OFFICE
CERTIFICATE OF CORRECTION

PATENT NO. : 7,175,680 B2  Page 1 of 1
APPLICATION NO. : 10/997607
DATED : February 13, 2007
INVENTOR(S) : Gracias It is certified that error appears in the above-identified patent and that said Letters Patent is hereby corrected as shown below:

In column 3, at line 57, delete "Any" and insert --any--.

Signed and Sealed this

Fifteenth Day of April, 2008

JON W. DUDAS
*Director of the United States Patent and Trademark Office*